(12) United States Patent
Theriault et al.

(10) Patent No.: US 9,778,868 B1
(45) Date of Patent: Oct. 3, 2017

(54) DATA RECORDER FOR PERMANENTLY STORING PRE-EVENT DATA (71) Applicant: GE AVIATION SYSTEMS, LLC, Grand Rapids, MI (US)

(72) Inventors: Bryan Adam Theriault, Grand Rapids, MI (US); Brian Jacob Loyal, Grandville, MI (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 15/170,212

(22) Filed: Jun. 1, 2016

(51) Int. Cl.
*G11C 7/00* (2006.01)
*G06F 3/06* (2006.01)
*G11C 14/00* (2006.01)

(52) U.S. Cl.
CPC .......... *G06F 3/0619* (2013.01); *G06F 3/065* (2013.01); *G06F 3/0656* (2013.01); *G11C 14/0045* (2013.01)

(58) Field of Classification Search
CPC .... G11C 7/04; G11C 11/406; G11C 11/40626
USPC ............................................. 365/211, 189.07
See application file for complete search history.

(56) References Cited

U.S. PATENT DOCUMENTS 8,470,645 B2  6/2013  Candelier et al.
9,122,286 B2 *  9/2015  Morimoto ........... G06F 12/0893

* cited by examiner

*Primary Examiner* — Son Dinh
(74) *Attorney, Agent, or Firm* — GE Global Patent Operation; William S. Munnerlyn (57) ABSTRACT

A data recorder for permanently storing pre-event data may include a read-write memory with a plurality of bit cells in the read-write memory. Each bit cell may have a bit state of a high value or a low value. A fusible structure in the data recorder may include a morphable element associated with each bit cell. A temperature-triggered module may thermally couple to the ambient environment and may electrically couple to each morphable element. The temperature-triggered module may be further configured to determine if a parameter of the ambient environment exceeds a predetermined threshold, and if so may then transmit a burn signal to the fusible structure so that each morphable element permanently secures the bit state for each bit cell.

20 Claims, 6 Drawing Sheets

|  | BIT ELECTRICAL VALUE (30) | |
| --- | --- | --- |
|  | LOW | HIGH |
| BURN SIGNAL Absent | unchanged | unchanged |
| BURN SIGNAL Present | unchanged | changed |

State of Morphable Element

FIG. 6

DATA RECORDER FOR PERMANENTLY STORING PRE-EVENT DATA

BACKGROUND OF THE INVENTION

A data recorder such as a flight data recorder may comprise a non-volatile flash memory recording pre-crash flight data for later recovery by crash investigators. In an event such as a crash, ambient conditions such as prolonged heat from a fire may corrupt data stored in bit cells of the read-write flash memory for several reasons, including charge migration within the bit cells. In the latter case, it is known to recover data by heating the read-write memory in a temperature chamber to re-establish the pre-crash bit states of the bit cells. However, the temperature-chamber technique may be ineffective for newer semiconductor geometries.

Another solution to the volatility of stored data under high temperature conditions is to save the data to a programmable ROM memory (a programming step). However, the programming step may draw down backup battery power better reserved for other purposes, such as a radio beacon contained in a flight data recorder. Additionally, a special burn voltage may be required to perform the programming step which is higher than the standard voltages within the read-write memory. Further, there may not be a reliable means to assess the ambient conditions so that a timely programming decision is made. Also, the memory controller performing read-write operations on the read-write memory may have failed, disabling any memory backup procedure. And finally, there may not be enough time to transfer data from a read-write memory to a programmable ROM before ambient conditions are too harsh for preserving data integrity.

SUMMARY OF THE INVENTION

In one embodiment, a data recorder for permanently storing pre-event data may include a read-write memory with a plurality of bit cells in the read-write memory. Each bit cell may have a bit state of a high value or a low value. A fusible structure in the data recorder may include a morphable element associated with each bit cell. A temperature-triggered module may thermally couple to the ambient environment and may electrically couple to each morphable element. The temperature-triggered module may be further configured to determine if a parameter of the ambient environment exceeds a predetermined threshold, and if so may then transmit a burn signal to the fusible structure so that each morphable element permanently secures the bit state for each bit cell.

In another aspect, a method of permanently storing pre-event data in a data recorder may include measuring a parameter of an ambient environment of the data recorder and comparing the parameter to a predetermined threshold. The method may further include transmitting a burn signal to a memory controller if the parameter exceeds the predetermined threshold. The pre-event data from a set of bit cells in a read-write memory may be copied to a set of bit cells in a write-only memory in the data recorder. Each bit cell in the write-only memory may have a morphable element. The method may further include conveying the burn signal to the morphable elements of the set of bit cells in the write-only memory after the copying, where conveying the burn signal may change the morphable elements and permanently secure a bit state for the set of bit cells in the write-only memory.

In yet another aspect, a method of permanently storing pre-event data in a data recorder may include measuring a parameter of an ambient environment of the data recorder and comparing the parameter to a predetermined threshold. The method may further include transmitting a burn signal to a morphable element associated with each bit cell in a read-write memory if the parameter exceeds the predetermined threshold. The method may further include gating the burn signal with a burn gate controlled by a bit state of each bit cell and changing the morphable element associated with the bit cell to permanently secure the bit state for the bit cell if the bit state is a high electrical value. The method may further include allowing the morphable element associated with the bit cell to remain unchanged if the bit state of the bit cell is not a high electrical value.

DETAILED DESCRIPTION

As may be appreciated, based on the disclosure, there exists a need in the art for permanently saving pre-event data stored in a read-write memory when conditions ambient to a data recorder containing the read-write memory pose a risk to a recovery of the data. Also, there exists a need in the art for a means to detect a high ambient temperature independently of system power and a method for generating power for burning in a permanent copy of the pre-event data stored in bit cells of the read-write memory. Further, there exists a need in the art for quickly saving read-write data without the step of copying and without a need for a memory controller.

Figure 1:
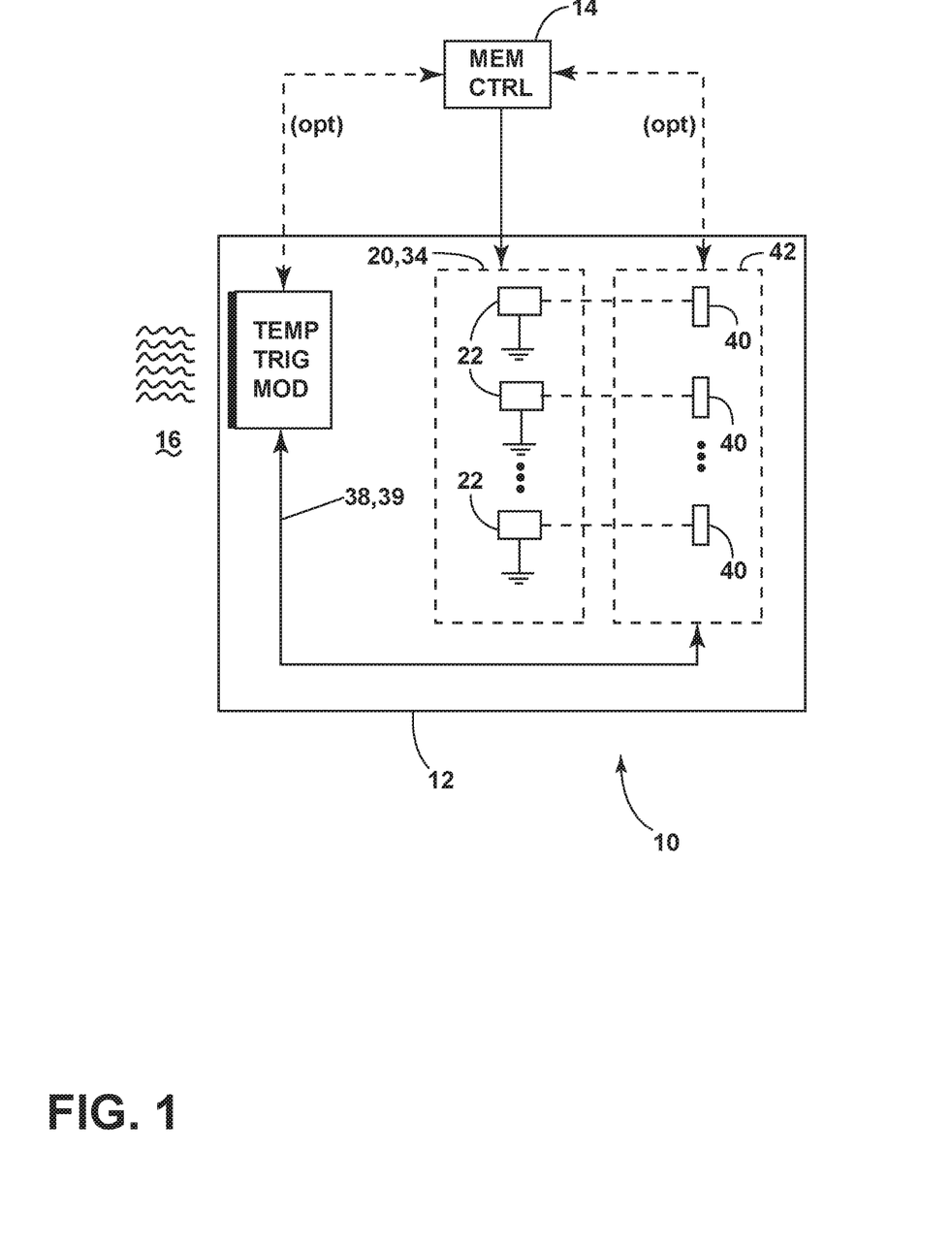
FIG. 1 illustrates a high-level diagram of a data recorder for permanently storing pre-event data, in accordance with an embodiment of the present disclosure.

Referring to FIG. 1, in various embodiments, a data recorder 10 for permanently storing pre-event data 34 when the pre-event data is at risk of becoming unrecoverable by exposure to an ambient environment 16 may comprise a read-write memory 20 having a plurality of bit cells 22. Memory 10 may be housed within a durable casing 12, such as in a flight data recorder whose contents are thermally insulated (not shown) from ambient environment 16. Each bit cell 22 may have a bit state of at least one of a high value or a low value. A fusible memory structure 42 may reside in the data recorder 10 and may comprise a morphable element 40 associated with each of the plurality of bit cells 22. Read-write memory 20 may comprise one array of bit cells 22 and the fusible structure 42 may be a second array of a write-only memory comprising morphable elements 40. Read-write memory 20 may be connected to a memory controller 14. Memory controller 14 may be coupled to a temperature-triggered module 50. Module 50 may be thermally coupled to ambient environment 16 and may be configured to electrically couple to each morphable element 40.

Figure 2:
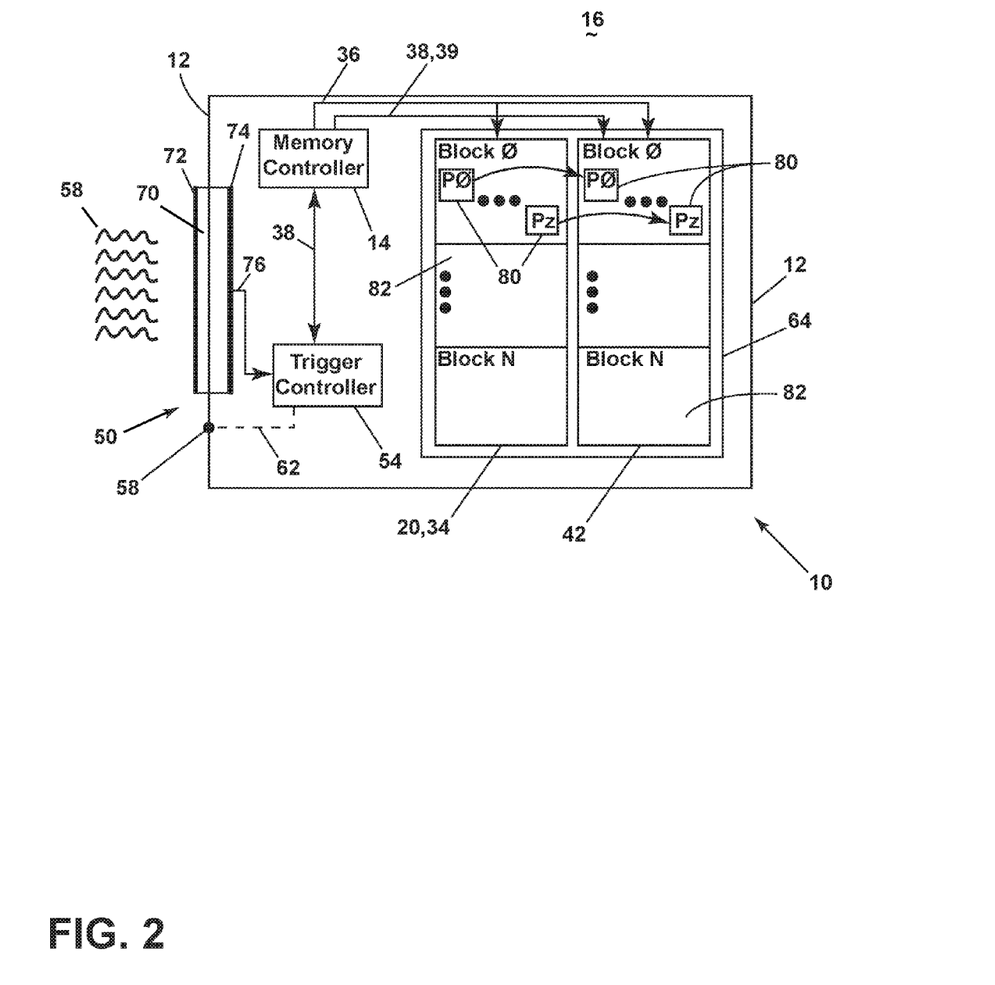
FIG. 2 illustrates a system diagram of a first embodiment of a data recorder for permanently storing pre-event data, in accordance with an embodiment of the present disclosure.
Figure 3:
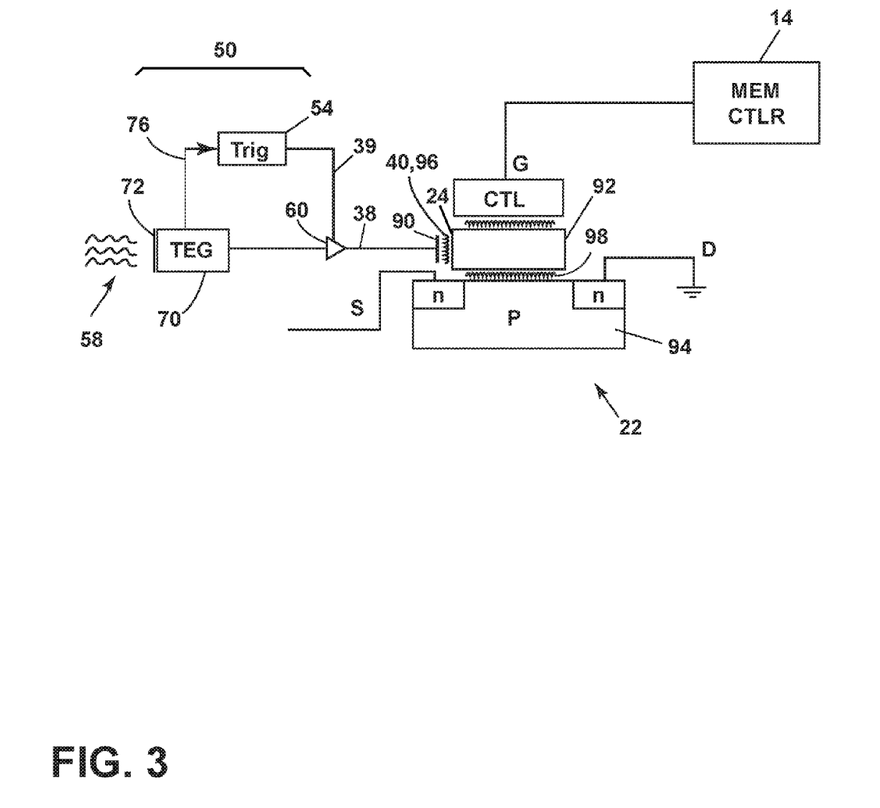
FIG. 3 illustrates a second embodiment at the bit cell level for a data recorder for permanently storing pre-event data, in accordance with an embodiment of the present disclosure.
Figure 4:
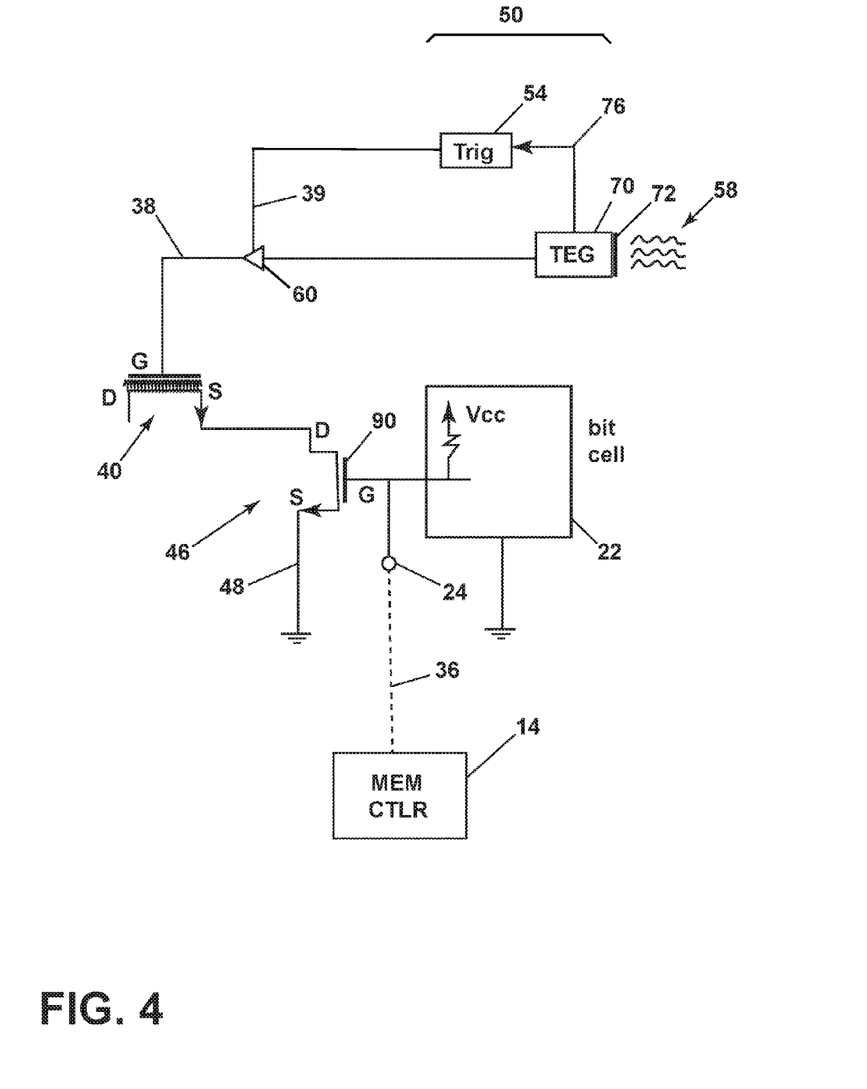
FIG. 4 illustrates a third embodiment at the bit cell level for a data recorder for permanently storing pre-event data, in accordance with an embodiment of the present disclosure.
Figure 5:
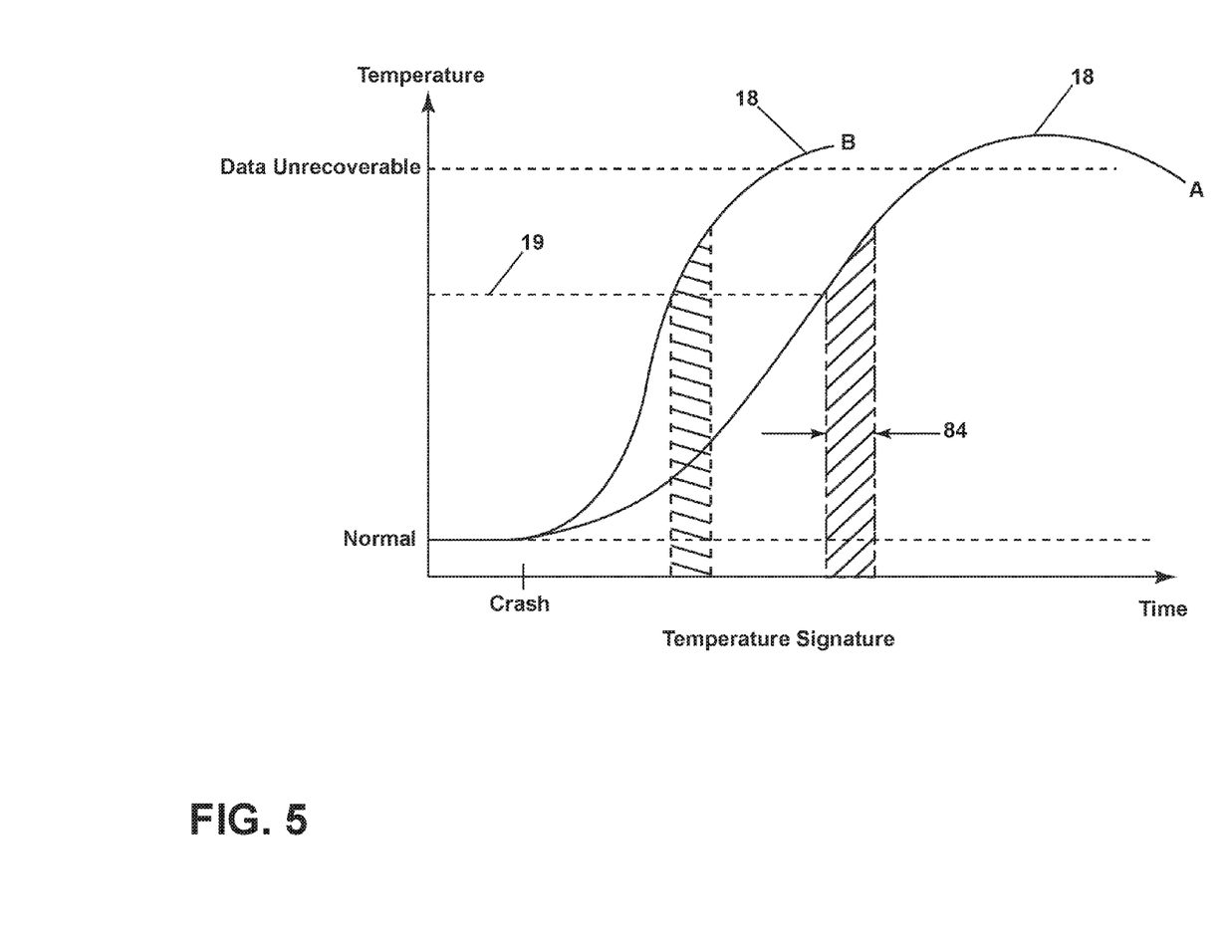
FIG. 5 illustrates a temperature signature of the ambient environment in a data recorder for permanently storing pre-event data, in accordance with an embodiment of the present disclosure.

Referring to FIGS. 1-4, temperature-triggered module 50 may be configured to determine if a parameter of ambient environment 16, such as an ambient temperature 58, exceeds a predetermined threshold 19, such as a temperature threshold 19 (FIG. 5). The parameter may include time in addition to temperature, or the parameter may include additional metrics such as acceleration, humidity, electromagnetics, and other metrics that indicate risk to preserving pre-event data. For example, the parameter may be one or more temperature signatures 18 (FIG. 5) predicting the imminent loss of data stored in read-write memory 20 prior to an event. If the parameter exceeds the predetermined threshold, temperature-triggered module 50 may be configured to transmit a burn signal 38 to fusible structure 42 so that each morphable element permanently secures the bit state for each bit cell (FIGS. 1, 3, and 4). A commit signal 39 may actuate the release of burn signal 38 to various morphable elements 40 (FIGS. 1 and 3-4).

Referring now to FIG. 2, in various embodiments, a data recorder 10 for permanently storing pre-event data 34 may comprise a read-write memory 20 having a plurality of bit cells (not shown) grouped into pages 80 and blocks 82. Memory 10 may be housed within a durable casing 12 of the data recorder and may be thermally insulated (not shown) from ambient environment 16. A fusible memory structure 42 may reside in the data recorder 10 and may comprise a morphable element (not shown) for each of the plurality of bit cells. Read-write memory 20 may comprise one array and fusible structure 42 may be a second array of a write-only memory comprising morphable elements 40. Both arrays may be connected to a memory controller 14 and the memory controller 14 may be coupled to a temperature-triggered module 50. Module 50 may be thermally coupled to ambient environment 16 and may be configured to electrically couple to fusible memory 42. Module 50 may include thermoelectric generator 70 generating output amplitude 76 and may include trigger controller 54 sensing ambient temperature 58 through temperature sense line 62 and may communicate burn signal 38 to memory controller 14. The read-write memory may be a non-volatile memory such as a flash memory, and may be subject to data loss due to extreme conditions in ambient environment 16.

Continuing with the embodiment of FIG. 2, if the parameter exceeds the predetermined threshold, memory controller 14 may be configured to copy pages 80 or blocks 82 of pre-event data from read-write memory 20 through read-write lines 36 to write-only memory 42 and, after copying the data, may convey the burn signal 38 from module 50 to the write-only memory 42 to permanently secure pre-event data 34. A commit signal 39 may actuate the release of burn signal 38.

Referring to FIGS. 1-4, in an embodiment, temperature-triggered module 50 may comprise a thermoelectric generator (TEG) 70 having a hot plate 72 and a cold plate 74 and generating the burn signal 38 with an output amplitude 76 substantially proportional to a temperature difference between the hot 72 and cold 74 plates. TEG 70 may be integrated into the casing 12 in order to thermally couple the hot plate 72 to ambient environment 16, and cold plate 74 may be configured to impress a large temperature difference across the TEG in order to maximize output amplitude 76 and burn signal 38. For example, cold plate 74 may face an interior (not shown) of the data recorder insulated from ambient environment 16. Alternately, hot plate 72 may be thermally coupled to ambient environment 16 through a heat pipe or thermal conduction element from an exterior of the casing 12 to a TEG 70 situated interior to the memory 10 (not shown). The TEG 70 may harvest electrical energy from precisely the environmental conditions (heat) which pose a risk to pre-event data 34, and may convert the heat energy into electrical power usable for generating burn signal 38 and for supplying operating power to the data recorder 10.

Continuing, in various embodiments, the output amplitude 76 of TEG 70 may be on the order of several volts, and may be exceed 10 volts or may exceed 20 volts, depending on the size of the thermoelectric array and the available temperature difference. TEG 70 may provide a voltage sufficient to change a conductivity of morphable element 40 such that morphable element 40 permanently records the bit state for the morphable element associated with it. Morphable element may be one of an anti-fuse or a fuse, and may require a burn signal to have a voltage higher than that readily available in a flash memory or a data recorder, but which may be available from a TEG. The embodiments depicted in FIGS. 3 and 4 represent anti-fuse configurations. However, fuse configurations are also possible and this disclosure extends to embodiments constructible with fuses using the principles disclosed herein with a simple reversal of polarity. An anti-fuse may exhibit a relatively high impedance prior to impressing the burn signal 38 across it, and may exhibit a relatively low impedance after burn signal 38 is passed through element 40.

Referring still to FIGS. 2-4, in various embodiments, temperature-triggered module 50 may include a trigger controller 54 coupling burn signal 38 to fusible structure 42 (FIG. 2) and to each morphable element 40 (FIGS. 3-4). Controller 54 may test ambient temperature 58 against threshold 19. Controller 54 may include signal conditioning (not shown) for regulating the voltage and/or current of burn signal 38 to an effective and non-damaging condition. In the distributed embodiments of FIGS. 3 and 4, where a morphable element 40 is positioned near each bit cell 22, controller 54 may also be in communication with memory controller 14 for coordinating a burn-in process with the read-write operations. Alternatively, burn signal 38 may be directed to conduct through morphable element 40 without any coordination with memory controller 14. Referring to FIGS. 3-4, trigger controller 54 may issue a commit signal 39 to a tri-state buffer 60 to deliver burn signal 38 to morphable element 40 when selected by a commit signal 39. Burn signal 38 may flow from TEG 70 through trigger controller 54 and onto morphable elements 40. Or, burn signal 38 may bypass controller 54 and flow from TEG 70 to morphable elements 40, where controller 54 performs only sensing and control functions, such as selecting tri-state buffer 60.

Referring again to FIG. 2, in this modular embodiment of the present disclosure, measuring a parameter of ambient environment 16 against a threshold may determine whether to initiate a burn-in process for protecting pre-event data 34 in a read-write memory 20 by copying the pre-event data though a memory controller 14 to a write-only memory 42 of morphable elements 40. Following the copying, the pre-event data 34 may be permanently secured (recorded) by passing a burn signal 38 from temperature-triggered module 50 to the appropriate morphable elements 40. For example, it may be necessary to send burn signal 38 only to morphable elements associated with bit cells having a bit state of either the high value or the low value, where the other bit state is secured by virtue of element 40 having an unchanged electrical characteristic. Memories 20 and 42 may be arranged on a common semiconductor platform 64, or may be on separate semiconductor platforms or may be in separate modules within the data recorder 10.

Continuing with FIG. 2, when data recorder 10 is a flight data recorder of an aircraft, pre-event data 34 may be sequentially recorded onto memory pages 80 of flash memory 20 until there is no more free memory space, whereupon the oldest data is written over. Therefore, a burn-in process for permanently storing pre-event data 34 may preferably entail copying the most recently recorded portion of pre-event data first, followed by copying a less recent portion of pre-event data. In this way, the most important data may be permanently stored in case the copy and burn process cannot be completed. Alternatively, read-write memory 20 may be copied and burned one memory page 80 at a time in some predetermined order. Burn period 84 (FIG. 5) may be the time required to permanently secure pre-event data for all of the plurality of bit cells, and threshold 19 may be chosen to complete burn period 84 prior to there being a risk of not recovering the data.

Referring now to FIGS. 3 and 4, in various embodiments showing a fusible structure distributed within a read-write memory, data recorder 10 may include a burn gate 90 disposed on a terminal 24 of the bit cell 22 and connected to temperature-triggered module 50. Terminal 24 may receive the bit state 30 of bit cell 22 and may thereby make the bit state available to burn gate 90. Bit state 30 may be a high electrical value or a low electrical value. Burn gate 90 may switch burn signal 38 to change morphable element 40 only when the bit state is the high electrical value. For example, referring to FIG. 3, the read-write memory 20 may be a flash memory and burn gate 90 may be disposed on a floating gate 92 of bit cell 22 being a MOSFET device, and morphable element 40 may comprise an oxide layer 96 on burn gate 90. The high electrical value may be an excess negative charge accumulated in floating gate 92 such that when burn signal 38 is applied, the combination of signal 38 and the excess negative charge breaks down the oxide layer, and may thereby change a conductivity of morphable element 40 and may cause a low input impedance at the burn gate. In contrast, a low electrical value for the bit state may represent an absence of charge in floating gate 92 such that the application of burn signal 38 may not cause a breakdown in oxide layer 96, and may leave morphable element 40 unchanged. Advantageously, the combination of burn gate 90 and oxide layer 96 may form both a switch and a morphable element 40 for permanently securing the bit state for all of the plurality of bit cells when the ambient environment 16 exceeds the predetermined threshold 19.

Continuing with FIG. 3, a high electrical value may correspond to an excess charge in floating gate 92 which may also correspond to a logical "0" for bit cell 22, where the high electrical value refers to a high turn-on threshold voltage for a flash cell. In an embodiment, the oxide layer 96 on burn gate 90 may be thinner than an oxide layer 98 between floating gate 92 and MOSFET channel 94, which may ensure that oxide layer 96 is the only layer that breaks down under the influence of burn signal 38 having a voltage much higher than typical read-write memory voltages. Memory controller 14 may connect to a control gate of flash cell 22 for reading and writing to the flash cell. The source and drain terminals of flash cells 22 may be connected in a NAND, a NOR, or in other configurations (not shown), and various means may be employed to recover the permanently stored pre-event data. For example, a low impedance at burn gate 90 may be detected by a test line (not shown) connecting the burn gate 90 of each bit cell 22 to a special recovery terminal (not shown). Or, a low impedance at burn gate 90 may be detected by a test line connecting burn gate 90 of each bit cell 22 to memory controller 14. Once the low-impedance burn gates in read-write memory 20 are determined to indicate a particular bit state, one may assume that the remaining bit cells have the opposite bit state, thereby recovering all of the pre-event data.

Continuing, in various embodiments, bit state 30 may comprise more than two electrical values, such as may be found in multi-level cells (MLC) of some flash memories. In the case of MLC flash memory, burn gate 90 and morphable element 40 may be configured to record two of the bit states of an MLC and additional circuitry may be provided to capture the remaining bit states in the event commit signal 39 releases burn signal 38. In an example not shown, a second burn gate having a second oxide layer may be added to a terminal of bit cell 22 for detecting a middle bit state, where a second burn signal testing for a middle electrical value utilizes a different voltage. Impedance measurements of the first and second burn gates may be logically combined to determine three or four bit states permanently stored in fusible structure 40.

In FIG. 4 there is another embodiment showing a fusible structure distributed within a read-write memory. The data recorder 10 may further comprise a switch 46 switchable by burn gate 90 and interposed between burn gate 90 and temperature-triggered module 50. For example, the switch 46 may be a transistor switch for enabling the burn signal to flow through a morphable element 40 connected between switch 46 and temperature-triggered module 50. Morphable element 40 may be an anti-fuse connected to the switch and may contain an insulating layer which breaks down under the influence of a sufficiently large voltage. Burn signal 38 may change a conductivity of the anti-fuse 40 to a low impedance when the high electrical value closes the switch 46. For example, anti-fuse 40 may be a high impedance prior to a passage of burn signal 38 and may have a low impedance after the passage of burn signal 38. Switch 46 may be a MOSFET, bipolar junction, or other switching device controllable by gate 90, and may have one terminal connected to a ground or may be connected to some other return path 48 for burn signal 38. Alternatively, the positions of switch 46 and morphable element 40 may be reversed.

Figure 6:
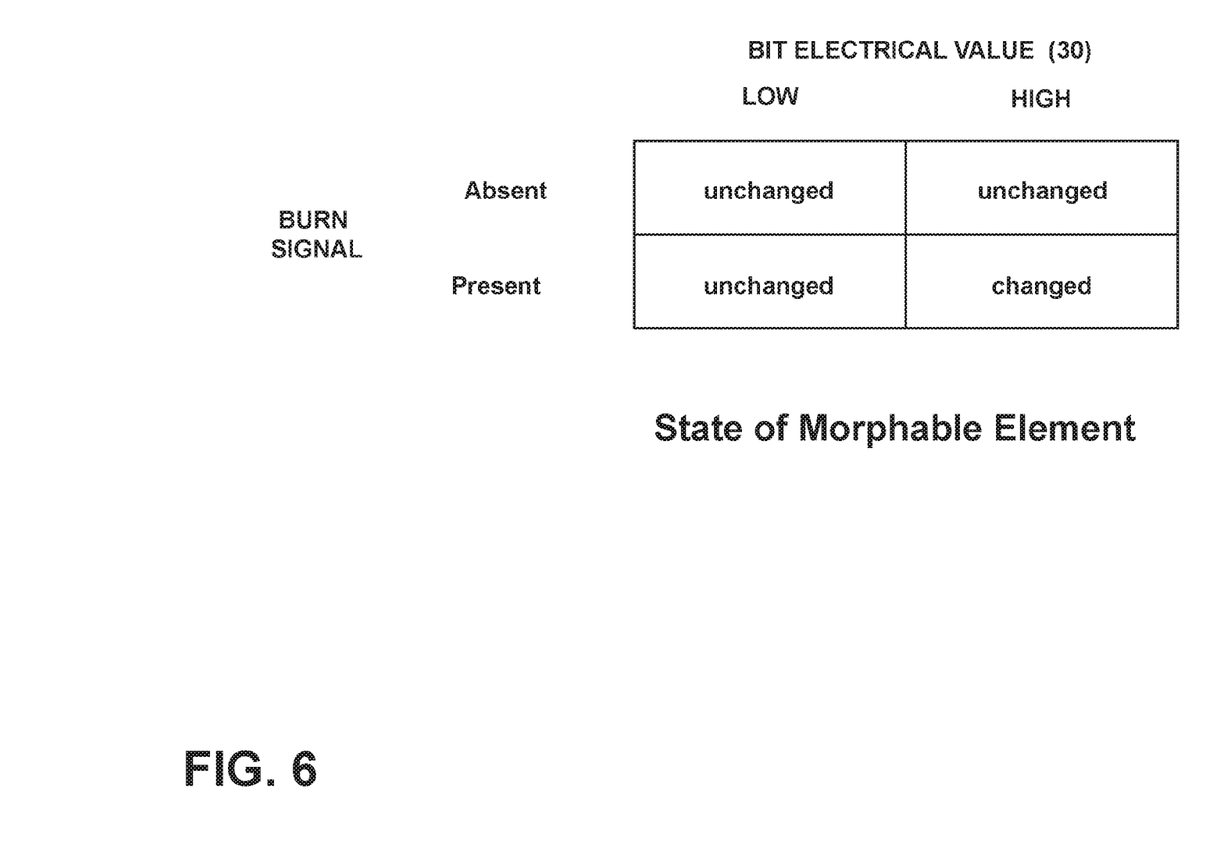
FIG. 6 illustrates a truth table for the morphable elements in a data recorder for permanently storing pre-event data, in accordance with an embodiment of the present disclosure.

Continuing with FIG. 4, in various embodiments, terminal 24 of the bit cell may connect to memory controller for reading the state of morphable element 40 during a post-event memory recovery process. Switch 46 may be turned on by memory controller 14 to test for a current flow in morphable element 40 and which may thereby determine whether element 40 is in a low impedance or high impedance state. The high electrical value may be a high voltage value available at terminal 24 for actively switching burn gate 90. Alternatively, switch 46 may be configured to enable burn signal 38 to change morphable element 40 when the bit state is a low electrical value. The high electrical state may be defined as one in which the combination of the high electrical state and the burn signal create a higher potential for changing the morphable element than the low electrical state, as shown in FIG. 6. In embodiments not shown, a morphable element may be placed in shunt across a terminal of the bit cell for responding both to the bit state and to the burn signal, thereby permanently recording the bit state of the pre-event memory. Furthermore, emergency events meriting permanent burn-in of the bit states in a read-write memory may include detecting extreme ambient temperatures or an ambient electromagnetic condition that threatens the integrity of read-write data 20.

In other embodiments not shown, morphable element 40 may comprise a phase-changing material that melts due to an application of the burn signal, where the melting may substantially change the physical characteristics for permanently representing the high electrical value of the bit cell. For example, a phase-changing element subjected to the burn signal may be detected by electrical measurement, by an electron microscope showing an altered molecular or crystalline structure, or by other means to detect a shift in physical properties. In particular, damage to the read-write memory during an event may include inoperable electrical pathways, an inoperable memory controller, and other impediments to traditional measurements of bit state. Alternatively, the melting may be configured to permanently represent the low electrical value.

Many other possible embodiments and configurations in addition to that shown in the above figures are contemplated by the present disclosure. To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" or "a plurality of" various elements have been described, it will be understood that "a set" or "a plurality" can include any number of the respective elements, including only one element. Combinations or permutations of features described herein are covered by this disclosure.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A data recorder for permanently storing pre-event data, the data recorder comprising:
   a read-write memory;
   a plurality of bit cells in the read-write memory, each bit cell having a bit state of at least one of a high value or a low value;
   a fusible structure in the data recorder and comprising a morphable element associated with each bit cell;
   a temperature-triggered module thermally coupled to the ambient environment and configured to be electrically coupled to each morphable element; and
   wherein the temperature-triggered module is further configured to determine if a parameter of the ambient environment exceeds a predetermined threshold, and then to transmit a burn signal to the fusible structure when the parameter of the ambient environment exceeds the predetermined threshold so that each morphable element permanently secures the bit state for each bit cell in response to the burn signal.

2. The data recorder of claim 1, wherein the morphable element is one of an anti-fuse, a fuse, or a phase-changing material that changes in response to the burn signal, where the change substantially alters the physical characteristics of the material to represent the high electrical value.

3. The data recorder of claim 1, further comprising two arrays of bit cells in the data recorder, one array with the read-write memory and the other array being a write-only memory comprising the morphable elements, and a memory controller connected to both arrays and to the temperature-triggered module, wherein the memory controller is configured to copy the pre-event data from the read-write memory to the write-only memory and convey the burn signal to the write-only memory.

4. The data recorder of claim 3, wherein the temperature-triggered module comprises a thermoelectric generator having a hot plate thermally coupled to the ambient environment and having a cold plate, the generator generating the burn signal with an amplitude substantially proportional to a temperature difference between the hot and cold plates.

5. The data recorder of claim 3, wherein the parameter comprises an ambient temperature and the predetermined threshold depends on at least a temperature threshold.

6. The data recorder of claim 3, wherein the data recorder is a flight data recorder for use in aviation.

7. The data recorder of claim 3, wherein pages of the read-write memory are copied and burned one page at a time.

8. The data recorder of claim 3, wherein a most recently recorded portion of the pre-event data is copied first, followed by copying a less recent portion of the pre-event data.

9. The data recorder of claim 1, further comprising a burn gate disposed on a terminal of the bit cell and connected to the temperature-triggered module, the terminal receiving the bit state of the bit cell, wherein the high value is a high electrical value and the low value is a low electrical value, and wherein the burn gate switches the burn signal to change the morphable element only when the bit state is at the high electrical value.

10. The data recorder of claim 9, wherein the read-write memory is a flash memory, the burn gate is disposed on a floating gate of each of the plurality of bit cells of the flash memory, the morphable element comprises an oxide layer on the burn gate, and the high electrical value is an excess negative charge in the floating gate, wherein the burn signal changes the oxide layer to cause a low input impedance at the burn gate.

11. The data recorder of claim 10, wherein the bit cell is a MOSFET and the oxide layer on the burn gate is thinner than an oxide layer between the floating gate and a channel of the MOSFET.

12. The data recorder of claim 9, further comprising a switch switchable by the burn gate and interposed between the burn gate and the temperature-triggered module, where the morphable element is an anti-fuse connected to the switch, and wherein when the high electrical value closes the switch the burn signal changes a conductivity of the anti-fuse to a low impedance.

13. The data recorder of claim 9, further comprising a tri-state buffer delivering the burn signal to the morphable element when selected by a commit signal controlling the tri-state buffer.

14. The data recorder of claim 9, wherein the morphable element comprises a phase-changing material that changes in response to the burn signal, the change substantially altering the physical characteristics of the morphable element to represent the high electrical value.

15. The data recorder of claim 9, wherein the temperature-triggered module comprises a thermoelectric generator having a hot plate thermally coupled to the ambient environment and having a cold plate, the generator generating the burn signal with an amplitude substantially proportional to a temperature difference between the hot and cold plates.

16. The data recorder of claim 9, wherein where the data recorder is a flight data recorder for use in aviation.

17. A method of permanently storing pre-event data in a data recorder, the method comprising:
   measuring a parameter of an ambient environment of the data recorder;
   comparing the parameter to a predetermined threshold;
   if the parameter exceeds the predetermined threshold, then transmitting a burn signal to a memory controller;
   copying the pre-event data from a set of bit cells in a read-write memory to a set of bit cells in a write-only memory in the data recorder, each bit cell in the write-only memory having a morphable element; and
   conveying the burn signal to the morphable elements of the set of bit cells in the write-only memory after the copying to change the morphable elements and permanently secure a bit state for each bit cell in the write-only memory.

18. The method of claim 17, further comprising generating the burn signal with a thermoelectric generator thermally coupled to the ambient environment.

19. A method of permanently storing pre-event data in a data recorder, the method comprising:
   measuring a parameter of an ambient environment of the data recorder;
   comparing the parameter to a predetermined threshold;
   if the parameter exceeds the predetermined threshold, then transmitting a burn signal to a morphable element associated with each bit cell in a read-write memory of the data recorder;
   gating the burn signal with a burn gate controlled by a bit state of each bit cell; and
   if the bit state is a high electrical value, changing the morphable element associated with the bit cell to permanently secure the bit state for the bit cell, and if the bit state of the bit cell is not a high electrical value, allowing the morphable element associated with the bit cell to remain unchanged.

20. The method of claim 19, further comprising generating the burn signal with a thermoelectric generator thermally coupled to the ambient environment.

* * * * *